United States Patent
Vu et al.

(10) Patent No.: US 6,219,591 B1
(45) Date of Patent: Apr. 17, 2001

(54) VOLTAGE INSTABILITY PREDICTOR (VIP)—METHOD AND SYSTEM FOR PERFORMING ADAPTIVE CONTROL TO IMPROVE VOLTAGE STABILITY IN POWER SYSTEMS

(75) Inventors: Khoi Tien Vu, Apex; Damir Novosel, Cary, both of NC (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/079,983

(22) Filed: May 15, 1998

(51) Int. Cl.$^7$ ................................... G05D 5/00

(52) U.S. Cl. ............................ 700/286; 700/295

(58) Field of Search .................. 700/292, 293, 700/294, 295, 286

(56) References Cited

U.S. PATENT DOCUMENTS

| | | | | |
|---|---|---|---|---|
| 5,187,454 | * | 2/1993 | Collins et al. ............................ | 333/32 |
| 5,455,776 | * | 10/1995 | Novosel ................................. | 364/492 |
| 5,642,000 | * | 6/1997 | Jean-Jumeau et al. ................ | 307/31 |
| 5,773,980 | * | 6/1998 | Yang ...................................... | 324/525 |
| 5,839,093 | * | 11/1998 | Novosel et al. ........................ | 702/59 |

OTHER PUBLICATIONS

Barbier, C. et al., "An Analysis of Phenomena of Voltage Collapse on a Transmission System", *Revue Generale de l'ELectricite*, 1980, 89(10), 672–690 (English Summary Included).

Begovic, M. et al., "Control of Voltage Stability Using Sensitivity Analysis", *IEEE Trans PWRS*, Feb. 1992, 7(1), 114–123.

Kessel, P. et al., "Estimating the Voltage Stability of a Power System", *IEEE Trans PWRD*, Jul. 1986, PWRD–1(3), 346–354.

Novosel et al., "Practical Protection and Control Strategies During Large Power–System Disturbances", *IEEE T&D Conf. Proceedings*, Los Angeles, Sep. 15–20, 1996.

Ohtsuka, K. et al., "An Equivalent of Multi–machine Power Systems and Its Identification for On–Line Application to Decentralized Stabilizers", *IEEE Trans. PWRS*, Feb. 1989, 4(2), 687–693.

Proceedings of the IEEE, Special Issue on Nonlinear Phenomena in Power Systems, Nov. 1995.

Proceedings of Bulk Power System Voltage Phenomena–III: Voltage Stability, Security and Control, Davos, Switzerland, Aug. 1994.

Taylor, C.W., Power System Voltage Stability, McGraw Hill, 1994.

Tuan, T. et al., "Emergency Load Shedding to Avoid Risks of Voltage Instability Using Indicators", *IEEE Trans. PWRS*, Feb. 1994, 9(1), 341–351.

Vu, K. et al., "Voltage Instability: Mechanisms and Control Strategies", *Proc. of IEEE*, Nov. 1995, 83(11), 1442–1455.

Vu, K. et al., "Grids Get Smart Protection and Control", *IEEE Comp. Appl. Power*, 1997, 40–44.

(List continued on next page.)

*Primary Examiner*—Thomas Lee
*Assistant Examiner*—Nitin Patel
(74) *Attorney, Agent, or Firm*—Woodcock Washburn Kurtz Mackiewicz & Norris LLP (57) ABSTRACT

A Voltage Instability Predictor (VIP) estimates the proximity of a power system to voltage collapse in real time. The VIP can be implemented in a microprocessor-based relay whose settings are changed adaptively to reflect system changes. Only local measurements (voltage and current) at the bus terminal are required. Contrary to the most common strategy to maintain voltage stability, which is to shed blocks of load when the voltage drops below a certain fixed threshold, which threshold is difficult to select since voltage magnitudes are a poor indicator of how close the system is to a collapse, the inventive VIP detects this proximity to collapse by monitoring the relationship between the apparent impedance $\bar{Z}_{app}$ and the Thevenin-impedance circle.

11 Claims, 5 Drawing Sheets

OTHER PUBLICATIONS

Vu, K. et al., "Use of Local Measurements to Estimate Voltage–Stability Margin", *IEEE*, 1997, 318–323.

Yabe, K. et al., "Conceptual Designs of AI–based Systems for Local Prediction of Voltage Collapse", *IEEE PWRS*, Feb. 1996, 11(1), 181–188.

IEEE Power Systems Relaying, Committee, Working Group K12, "Voltage Collapse Mitigation", 1995.

Use of local Measurement to Estimate Voltage–Stability Margin By Khoi Vu, Miroslav M. Begovic, Damir Novosel and Murari Mohan Saha, Jan. 1997.*

* cited by examiner

VOLTAGE INSTABILITY PREDICTOR (VIP)— METHOD AND SYSTEM FOR PERFORMING ADAPTIVE CONTROL TO IMPROVE VOLTAGE STABILITY IN POWER SYSTEMS

FIELD OF THE INVENTION

The present invention relates generally to power systems and protective relays employed therein, and more particularly to methods and apparatus for adaptively shedding load to improve stability in the power system.

BACKGROUND OF THE INVENTION

Voltage instability is closely related to the notion of maximum loadability of a transmission network. In present-day power systems, this may take place as a precursor to the traditional frequency instability problem (see Proceedings of Bulk Power System Voltage Phenomena-III: Voltage Stability, Security and Control, Davos, Switzerland, August 1994; and K. Vu, et al., "Voltage Instability: Mechanisms and Control Strategies," Proc. of IEEE, Special Issue on Nonlinear Phenomena in Power Systems, pp. 1442–1455, November 1995). It is critical for the utility company to track how close the transmission system is to its maximum loading. If the loading is high enough, actions have to be taken to relieve the transmission system.

A problem associated with tracking the maximum loading of the transmission system is that such maximum loading is not a fixed quantity, but rather depends on the network topology, generation and load patterns, and the availability of VAR resources. All of these factors can vary with time due to scheduled maintenance, unexpected disturbances, etc.

Despite the fact that voltage instability is a system problem, there is still a need for relays that process only local measurement. These relays are to be counted upon when other controls cannot mitigate the aggravating situation; they also form the fall-back position for any global protection scheme when communication channels fail. Controls that use only local data provide an attractive approach because they are low cost and simple to build. The most common form is to shed load based on voltage level—undervoltage load shedding. This scheme has been attempted on the Pacific Northwest system, as reported by C. W. Taylor, Power System Voltage Stability, McGraw Hill, 1994. However, for many other systems, the difficulty with choosing the setpoint poses a challenge. In fact, voltage is often a poor indicator of instability, and a fixed setpoint may result in unnecessary shedding or failure to recognize an instability. Some systems may ride through voltages much below the setpoint of the relay but, for others, the voltage can appear normal even though the grid is on the verge of instability. The idea of using an adjustable voltage setpoint has been known, as reported in IEEE Power Systems Relaying, Committee, Working Group K12, "Voltage Collapse Mitigation," 1995.

The true goal of a local relay should be to determine whether the load connected to the substation is excessive. A fundamental issue here is whether the transmission system's strength can be "sensed" from local measurements. It has been well known that conventional, local quantities such as voltage level and reactive reserve are poor indicators of voltage instability, and therefore advanced methods are needed. For example, the use of artificial intelligence on local measurements is disclosed in K. Yabe, et al., "Conceptual Designs of AI-based Systems for Local Prediction of Voltage Collapse," IEEE 95 WM 181-8 PWRS. The idea is to simulate a range of system conditions to generate patterns in local observations. In the real environment, true measurements are then compared against known patterns, from which the proximity to collapse is inferred.

SUMMARY OF THE INVENTION

In contrast to the above-described methods, the present invention provides a method that is quite simple and does not require off-line simulation and training. Based on local measurements (voltage and current), it produces an estimation of the strength/weakness of the transmission system connected to the bus, and compares that with the local demand. The closer the local demand is to the estimated transmission capacity, the more imminent is the voltage instability. This information can be used for load shedding as well as other applications.

The present invention may be embodied or implemented in a device referred to as a Voltage Instability Predictor, or VIP. Such a VIP in accordance with the present invention comprises the steps of, or means for, measuring current and voltage waveforms at the bus, and deriving current and voltage phasors therefrom; based on the current and voltage phasors, determining an apparent impedance ($\bar{Z}_{app}$) associated with the load and a Thevenin impedance ($\bar{Z}_{Thev}$) associated with the source; comparing the Thevenin impedance and apparent impedances; and deciding whether to initiate a prescribed action based on the relationship of the apparent impedance to the Thevenin impedance.

The Thevenin impedance is tracked by a curve-fitting technique. In one example of such a technique, the Thevenin impedance is estimated based on the following equation:

$$\bar{E} = \bar{V} + \bar{Z}_{Thev} \bar{I},$$

where $\bar{E} = E_r + jE_i$ is the Thevenin source voltage, $\bar{V} = u + jw$ is the measured voltage phasor at the bus, and $\bar{I} = g + jh$ is the measured current phasor at the bus. The quantities g, h, u and w are available from the measurements at the bus.

Other features of the present invention are disclosed below.

DETAILED DESCRIPTION OF PREFERRED EMBODIMENTS

A presently preferred implementation of the invention is described below. An overview of the inventive solution is presented first, and then a detailed discussion is presented.

A. Overview

Figure 1:
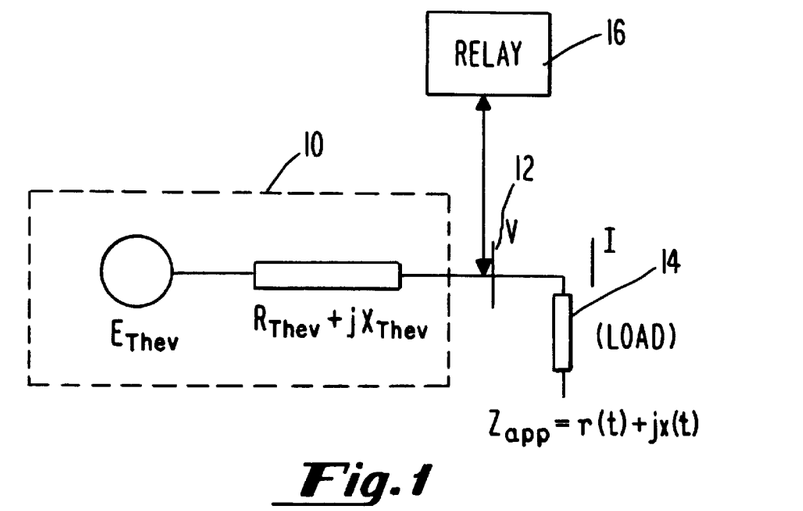
FIG. 1 schematically depicts an electrical energy transmission system in accordance with the present invention.

Consider the problem of tracking how close the loading at a bus is to the limit of a transmission system. Voltage instability takes place when the loading reaches this limit. For the problem at hand, the system is represented as a Thevenin equivalent 10, as shown in FIG. 1. The local bus 12, load 14 and local relay 16 are also shown in FIG. 1. The Thevenin equivalent comprises a source voltage $E_{Thev}$ and impedance $Z_{Thev} = R_{Thev} + jX_{Thev}$.

The following power-flow equation ties the voltage $\bar{V}$ at the load bus to the power demand P+jQ.

$$\frac{P + jQ}{\bar{V}} = \bar{I}^* = \left(\frac{\bar{E} - \bar{V}}{\bar{Z}_{Thev}}\right)^*$$

$$\Rightarrow (P + jQ) \cdot \bar{Z}^*_{Thev} = \bar{V}(\bar{E} - \bar{V})^*$$

For a given power transfer P+jQ, the above equation admits at most two voltage solutions $\bar{V}$. Maximal power transfer is reached when the two solutions coincide, i.e., when $$\bar{V} = (\bar{E} - \bar{V})^*.$$

Plugging in the apparent impedance, $\bar{Z}_{app}$, we see that maximal power transfer occurs when, $$\bar{Z}_{app}\bar{I} = (\bar{Z}_{Thev}\bar{I})^*$$

or $$\bar{Z}_{app} = \bar{Z}^*_{Thev} \times 1 \angle -2\delta_I.$$

Figure 2:
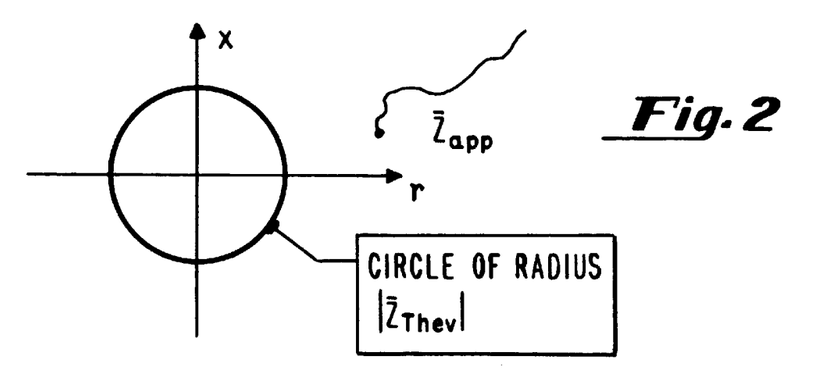
FIG. 2 depicts an exemplary graph of a Thevenin impedance circle ($|\bar{Z}_{Thev}|$=constant) in the impedance plane and is referred to below in explaining that maximal power transfer, and thus voltage instability, occurs when the apparent impedance ($\bar{Z}_{app}$) of the load intersects (or approaches a region surrounding) the Thevenin impedance circle.

Since the angle $\delta hd I$ could be any number between 0 and $2\pi$, it follows that maximal power transfer occurs when $\bar{Z}_{app}$ is on the circle centered at 0 and of radius $|\bar{Z}_{Thev}|$. Thus, the proximity of $\bar{Z}_{app}$ to the $\bar{Z}_{Thev}$ circle indicates proximity to voltage instability. This analysis is depicted in FIG. 2.

Adaptive Load-Shedding Relay

The relay logic is quite simple and involves checking how close $\bar{Z}_{app}$ is to the $\bar{Z}_{Thev}$ circle. $\bar{Z}_{app}$, being the apparent impedance of the load, is readily available from local measurements. It is the tracking of the Thevenin impedance $\bar{Z}_{Thev}$ that makes the relay adaptive. The Thevenin impedance can be obtained via a parameter-estimation process. The fundamental equation that ties $\bar{Z}_{Thev}$ to $\bar{Z}_{app}$ is:

$$|\bar{Z}_{Thev} + \bar{Z}_{app}| \times I = \bar{E}_{Thev}$$

or, $$(R_{Thev} + r_{app})^2 + (X_{Thev} + x_{app})^2 = E^2_{Thev}/I^2$$

In the above equation, the three unknowns are $R_{Thev}$, $X_{Thev}$ and $E_{Thev}$ and the set of measurements is $\{r_{app}, x_{app}, I\}$. If three or more measurement sets are acquired, the equation can be solved for the unknowns.

Comparison With Existing Practices

Even though existing under-voltage relays are in wide use throughout the world, their settings are very difficult to select. Some systems have a setting of 0.95 p.u., but quite often a voltage falling below this level is still operable whereas, at other times, the system may collapse at voltages above the setpoint. Below and in FIG. 3, we explain why this happens and why the present invention is robust against such problems.

Figure 3:
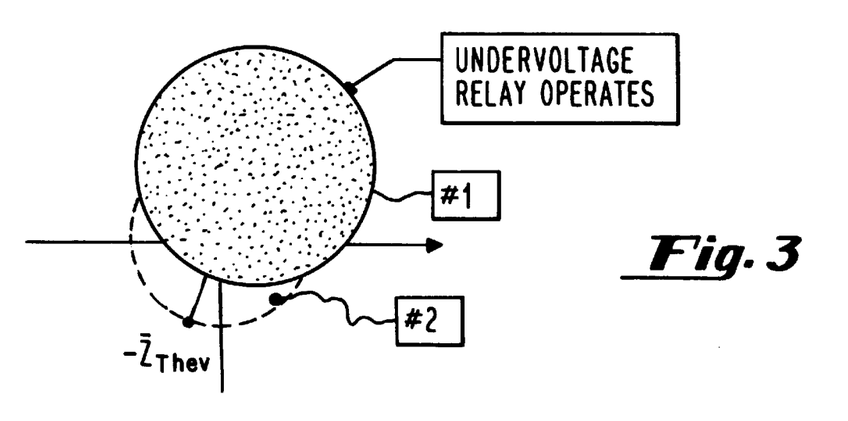
FIG. 3 is a graph that is referred to below in contrasting the operation of a relay in accordance with the present invention with that a conventional undervoltage relay.

Suppose that the Thevenin equivalent is fixed at 1.05 p.u. and the voltage threshold for load shedding at the local bus is set at 0.95 p.u. We try to map this to the impedance diagram.

$$\frac{|-\bar{Z}_{app} - \bar{Z}_{Thev}|}{|-\bar{Z}_{App}|} = \frac{|\bar{E}|}{|\bar{V}|} = \frac{1.05}{0.95} = 1.105$$

That is, voltage instability is perceived by the relay when the distance between $\bar{Z}_{app}$ and $-\bar{Z}_{Thev}$ is more than 1.105 the distance separating $\bar{Z}_{app}$ and 0. The locus of all such $\bar{Z}_{app}$ points is itself a circle, as illustrated in FIG. 3. The under-voltage locus does not coincide with the true voltage instability region, which can result in misoperation. For example, Trajectory #1 enters the operating region of the relay and may result in load shedding if the wait time has expired. On the other hand, Trajectory #2 has entered the voltage instability region but the condition is not recognized by the undervoltage relay.

B. Detailed Discussion

FIG. 1, as mentioned, depicts a load bus and the rest of the system treated as a Thevenin equivalent. Equating the receiving and sending currents, one has (note that the subscript "Thev" has been dropped from $\bar{E}$):

$$\frac{P + jQ}{\bar{V}} = \bar{I}^* = \left(\frac{\bar{E} - \bar{V}}{\bar{Z}_{Thev}}\right)^*$$

$$(P+jQ) \cdot \bar{Z}^*_{Thev} = \bar{V}(\bar{E} - \bar{V})^* \qquad (1)$$

For a given power transfer P+jQ, the phasor equation (1), which is quadratic, admits at most two voltage solutions $\bar{V}$. Observe the symmetry in equation (1); that is, if $\bar{V}$ is one solution then the other solution can be found simply by computing $(\bar{E} - \bar{V})^*$. The two solutions become one (i.e., bifurcation) at maximal power transfers; a further increase in power demand will yield no solution.

In summary, maximal power transfer occurs when $$\bar{V} = (\bar{E} - \bar{V})^* \qquad (2)$$

Plugging in the apparent impedance reveals that maximal power transfer occurs when, $$\bar{Z}_{app}\bar{I} = (\bar{Z}_{Thev}\bar{I})^* \qquad (3)$$

or simply, $$|\bar{Z}_{app}| = |\bar{Z}_{Thev}|. \qquad (4)$$

It is noted that no assumption has been made about the characteristic of the load. The apparent impedance $\bar{Z}_{app}$ is merely the ratio between the voltage and current phasors measured at the bus 12 (FIG. 1). Relation (4), holding true regardless of the load characteristic, separates the impedance plane into two regions as shown in FIG. 2. As the load varies, its $\overline{Z}_{app}$ traces a path in the plane and voltage instability occurs, in the steady-state sense, when $\overline{Z}_{app}$ crosses the Thevenin circle.

Tracking closeness to voltage instability, therefore, can be accomplished by tracking the distance of the present-time $\overline{Z}_{app}$ to the Thevenin circle. This circle is by no means a fixed object since it represents the entire system lumped together. Such collection involves thousands of devices, any of which can change at a given time. It is more likely in a situation of voltage instability that the circle will expand (transmission becoming weaker) and the impedance $\overline{Z}_{app}$ will move toward the circle (load becoming heavier). (A weakened transmission and increased loading are two common symptoms of voltage collapse.) The present invention teaches one to track the Thevenin impedance and to use it as the reference for voltage stability. This idea has been suggested briefly in D. Novosel et al., "Practical Protection and Control Strategies During Large Power-System Disturbances," IEEE T&D Conf. Proceedings, Los Angeles, Sep. 15–20, 1996.

The following observations can be made in view of the foregoing:

1. Relation (4) can be found in various forms in textbooks on basic circuit theory. Its connection to voltage collapse has been addressed in early works in the field, such as C. Barbier and J. Barret, "An Analysis of Phenomena of Voltage Collapse on a Transmission System," Revue Generale de 1' Electricite, pp. 672–690; and P. Kessel and H. Glavitsch, "Estimating the Voltage Stability of a Power System," IEEE Trans. PWRD, July 1986, pp. 346–354. In particular, Kessel and Glavitsch derived a condition similar to (2) and used it as the basis for a voltage-collapse index. French researchers demonstrated the potential of this index (L-index) in their load-shedding scheme described in T. Tran et al., "Emergency Load Shedding to Avoid Risks of Voltage Instability Using Indicators," IEEE Trans. on PWRS, February 1994, pp. 341–351. L-indices, as well as other competing indices (see an overview in K. Vu, et al., "Voltage Instability: Mechanisms and Control Strategies," cited above), require that the network information be known (topology, loads, generators, etc.). Therefore, they can only be implemented at the control center with communication links to the substations. The inventive method disclosed herein has its own merit and is unique because it is tailored for relay applications and involves only local measurements.

2. In a dynamic power-system model, voltage collapse can occur before the maximum power transfer (e.g., as discussed in Proceedings of the IEEE, Special Issue on Nonlinear Phenomena in Power Systems, November 1995). However, due to practical considerations, it is necessary to base a design on simplified system models.

Tracking the Thevenin Equivalent

Tracking the Thevenin equivalent is essential to detection of voltage collapse. There are many methods to track the Thevenin parameters. The use of a Kalman filter is discussed in K. Ohtsuka et al., "An Equivalent of Multi-machine Power Systems and Its Identification for On-Line Application to Decentralized Stabilizers," IEEE Trans. on PWRS, February 1989, pp. 220–228, in connection with the problem of out-of-step protection ($R_{Thev}$ was assumed zero). In this specification, we apply the traditional curve-fitting technique. We base the tracking on the following equation:

$$\overline{E} = \overline{V} + \overline{Z}_{Thev}\overline{I} \quad (5)$$

Denote $\overline{E} = E_r + jE_i$, $\overline{V} = u + jw$ and $\overline{I} = g + jh$. Equation (5) can be rewritten as:

$$\begin{bmatrix} 1 & 0 & -g & h \\ 0 & 1 & -h & -g \end{bmatrix} \times \begin{bmatrix} E_r \\ E_i \\ R_{Thev} \\ X_{Thev} \end{bmatrix} = \begin{bmatrix} u \\ w \end{bmatrix}$$

Note that g, h, u and w are directly available from the measurements at the local bus. The unknowns are $R_{Thev}$, $X_{Thev}$ and $E_r$ and $E_i$. Clearly, measurements taken at two or more different times are required to solve for the unknowns. In a real environment, measurements are not precise and the Thevenin parameters drift due to the system's changing conditions. To suppress oscillations, a larger data window should be used. The estimation therefore attempts to minimize the error in a least-squares sense. The discussion in this specification is to demonstrate the new relay method. Toward actual implementation, attention will be paid to practical issues such as data memory, window size, noise in measurements, close-by faults, and so on.

Numerical Examples

The standard IEEE 39-bus system is chosen for the exemplary system. To simulate voltage collapse, the demand at each of the load buses is gradually increased until the power-flow equations become unsolvable. For illustration, the same percentage of load increase is used for all loads. The critical percentage is 163.4%.

A relay incorporating a monitoring device, or VIP, in accordance with the present invention is placed at each load bus to process the local measurements (bus voltage and load current) based on a least-squares fitting and a moving window. The monitoring device's output is a stream of Thevenin parameters (as a function of time). Note that each monitoring device has access to the local information only and is unaware of the changes that take place in the rest of the network. Those changes can involve load increases at other buses and generators reaching reactive limits.

The ability to track the Thevenin parameters is a numerical issue and is only part of the picture. The other part, even more important, is to check whether the estimated Thevenin impedance always merges with the load impedance at the point of collapse. That is, the main purpose of the numerical examples is to verify the theoretical condition of equation (4) in a multi-node network.

Figure 4:
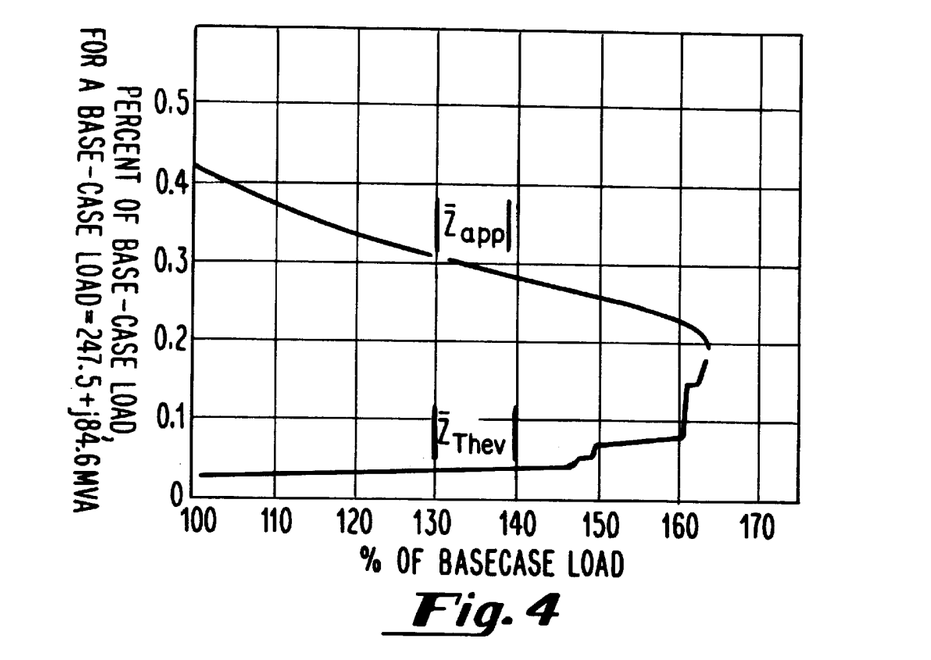
FIG. 4 is an exemplary graph of Thevenin impedance magnitude $|\bar{Z}_{Thev}|$ and load impedance magnitude $|\bar{Z}_{app}|$ versus percent of base-case load, for a base-case load= 247.5+j84.6 MVA.

FIG. 4 depicts the variation in the local apparent impedance $|\overline{Z}_{app}|$ at bus #23 and the Thevenin impedance $|\overline{Z}_{Thev}|$ seen from this bus. Note that only the magnitudes of these impedances are plotted since the concern here is to verify equation (4). The load increase is evident by a decaying load-impedance profile. The Thevenin impedance increases slightly until the load level reaches 145%, after which there occur a number of sharp rises (at 146%, 149%, 160% and beyond). A check with a power-flow solver reveals that these points coincide with individual generators reaching their respective reactive limits.

It is clear from FIG. 4 that the two impedances, Thevenin ($|\overline{Z}_{Thev}|$) and load ($|\overline{Z}_{app}|$), come together at the point of collapse. They do not become exactly equal because the Thevenin value is estimated and thus lags the true value (the method involves a moving window). Nevertheless, the fact that the two impedances converge toward each other is evidence that equation (4) holds for maximal power transfer.

Figure 5:
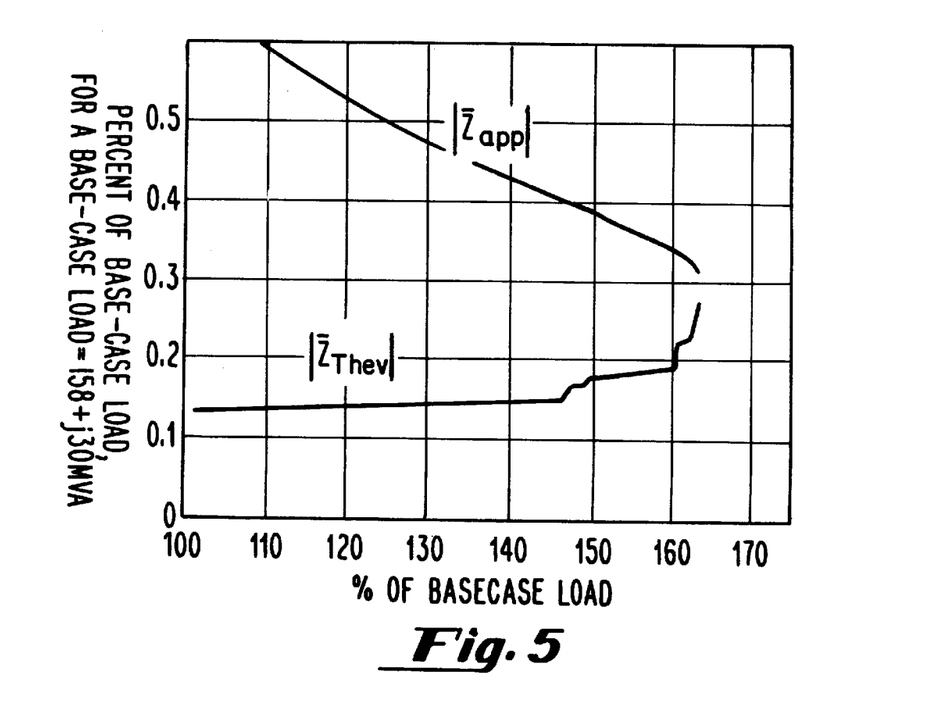
FIG. 5 is a graph similar to FIG. 4 for a base-case load=158+j30 MVA.

The curves for all other load buses share the same characteristic. FIG. 5 shows the results for Bus #18 as another example.

Comparison with Conventional Under-voltage Relay

Under-voltage relays provide a simple, cost-effective mitigation of voltage collapse. They "detect" a collapse by comparing the local voltage against a fixed threshold. If the voltage drops and stays below the threshold, then the usual practice is to shed a block of load. Multiple thresholds are possible, and each threshold is linked to a separate block of load.

It is convenient to map the operation of a conventional under-voltage relay to the impedance plane. Consider a relay with a setpoint of 0.95 p.u. Let "V" be the voltage at the local bus and "E" be the voltage of the Thevenin source. One then has:

$$\frac{E}{V} = \frac{E/I}{V/I} = \frac{|\overline{Z}_{app} + \overline{Z}_{Thev}|}{|\overline{Z}_{App}|}$$

For illustration, assume that the Thevenin voltage at the present moment is 1.05 p.u. Then the under-voltage relay operates when $$\frac{|\overline{Z}_{app} + \overline{Z}_{Thev}|}{|\overline{Z}_{App}|} > \frac{1.05}{0.95} = 1.105$$

which represents a circle in the impedance plane. The relative position between such a circle and the Thevenin circle is shown in FIG. 3. The two circles clearly do not coincide. Recall that the Thevenin circle represents maximal power transfer (relation (4)). Thus, wherever the two circles do not overlap represents misoperation of the conventional under-voltage relay. An impedance trajectory such as #1 is yet to reach maximal power transfer, but is treated by the conventional relay as voltage instability. An impedance trajectory such as #2 has clearly reached maximal transfer yet it is not detected by the conventional relay.

Interpretations of the Invention

The present invention can be advantageously implemented and viewed as an adaptive relay. Two different interpretations are presented below.

The first interpretation of the invention is obvious from equation (4) and FIG. 2: An impedance relay with a self-tuned setting. Voltage collapse occurs when the load impedance is equal to the Thevenin impedance.

Figure 6:
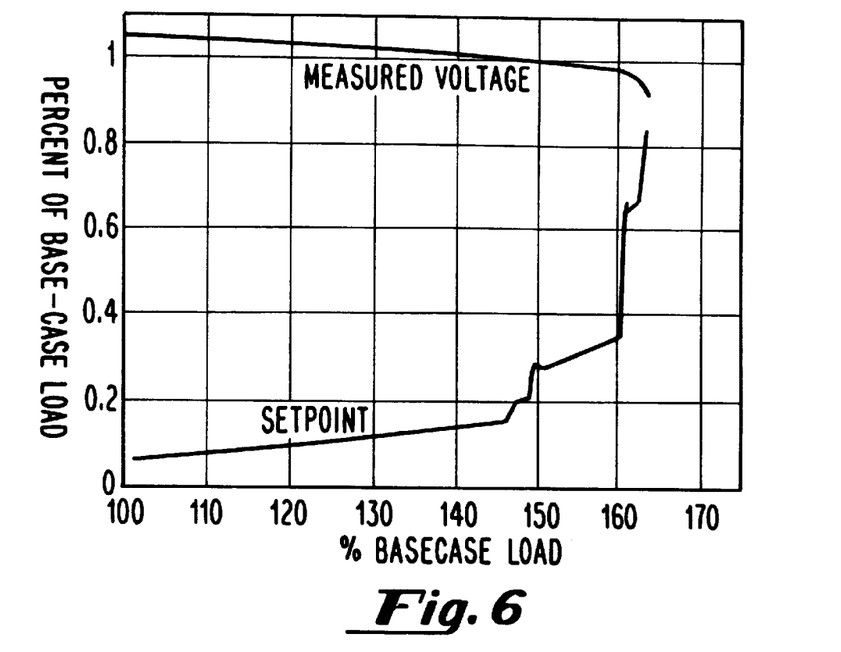
FIG. 6 is an exemplary graph of measured voltage and setpoint versus percent of base-case load.

The second interpretation is based on equation (2), which implies that at the point of collapse the load voltage is equal to the voltage drop across the Thevenin impedance. This interpretation can be seen clearly when one multiplies the two curves in FIG. 4 with the load current profile. The result is shown in FIG. 6. The top curve is associated with the (measured) load voltage, and the bottom curve the (calculated) voltage drop across the Thevenin impedance. If one views the bottom curve as the voltage setpoint of the relay, then clearly the setpoint is tuned so that, at the collapse, the load voltage is equal to the setpoint. Therefore, the monitoring device is a voltage relay with an adaptive setpoint.

Use of Invention in Load Shedding

It is clear from FIGS. 4, 5 and 6 that the adaptive setpoints (the bottom curve ($|\overline{Z}_{Thev}|$) in each figure) can experience a sharp jump if there is a change in the network structure. (In the examples, the change is a PV-node switched to a PQ-node.) Such a sharp transition poses a challenge with respect to implementation of the invention. For example, in FIG. 3, the "distance to collapse" is about 0.15 (per unit impedance) when the load level is 160%; however, a slight increase in load cuts this distance to 0.07. This means that it is risky to wait for the distance to drop to zero before issuing control actions.

To use the inventive method most effectively, one should act on the conservative side. That is, one should set a margin and the device should act when the margin is violated. The choice of margin, of course, depends on the bus, and also involves heuristics. For example, one may want to set the margin for bus 23 to be 0.15 (per unit impedance). With this choice, the voltage collapse is "detected" when the load reaches 160%. This impedance-based margin can be converted to power ($I^2Z$), in which case the margin represents the extra megawatts (MW) or MVAR that can be delivered to the bus before voltage collapse can take place. Thus, the load at a bus is deemed excessive when the power margin is violated. Load can be shed so as to restore the margin. Clearly, the amount of load to be shed is not fixed and thus the monitoring device provides a form of adaptive load shedding.

Shedding load to maintain a desired power margin is just one philosophy. Sensitivity-based load shedding is another method whose analysis was given in M. Begovic and A. Phadke, "Control of Voltage Stability Using Sensitivity Analysis," IEEE Trans. on PWRS, February 1992, pp. 114–123. The method was described for a central-control application. In the following paragraph, we provide a variation of the method where local data are used.

Figure 7:
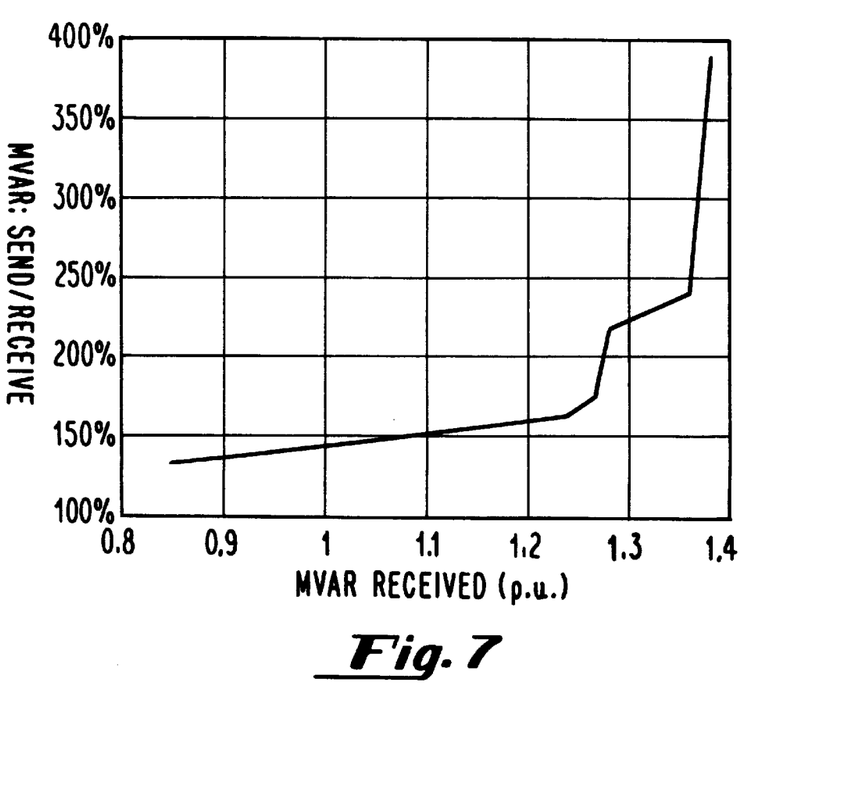
FIG. 7 is an exemplary graph of MVAR supplied by the system versus MVAR consumed at the bus.

One way to determine whether the load is excessive is by comparing the amount of power supplied by the Thevenin source (see FIG. 1) and the power actually consumed at the bus. The case for bus 23 is depicted in FIG. 7. The horizontal axis is the MVAR consumed by the bus (1 p.u.=100 MVA). The vertical axis is the MVAR supplied by the Thevenin source, represented as percentage of the received MVAR. For example, when the MVAR demand at the bus reaches 1.27 p.u., the source has to supply 200% of that amount; that is, for every 2 units sent, 1 is lost in the transmission. This analysis can be used to guide the selection of a threshold.

Figure 8:
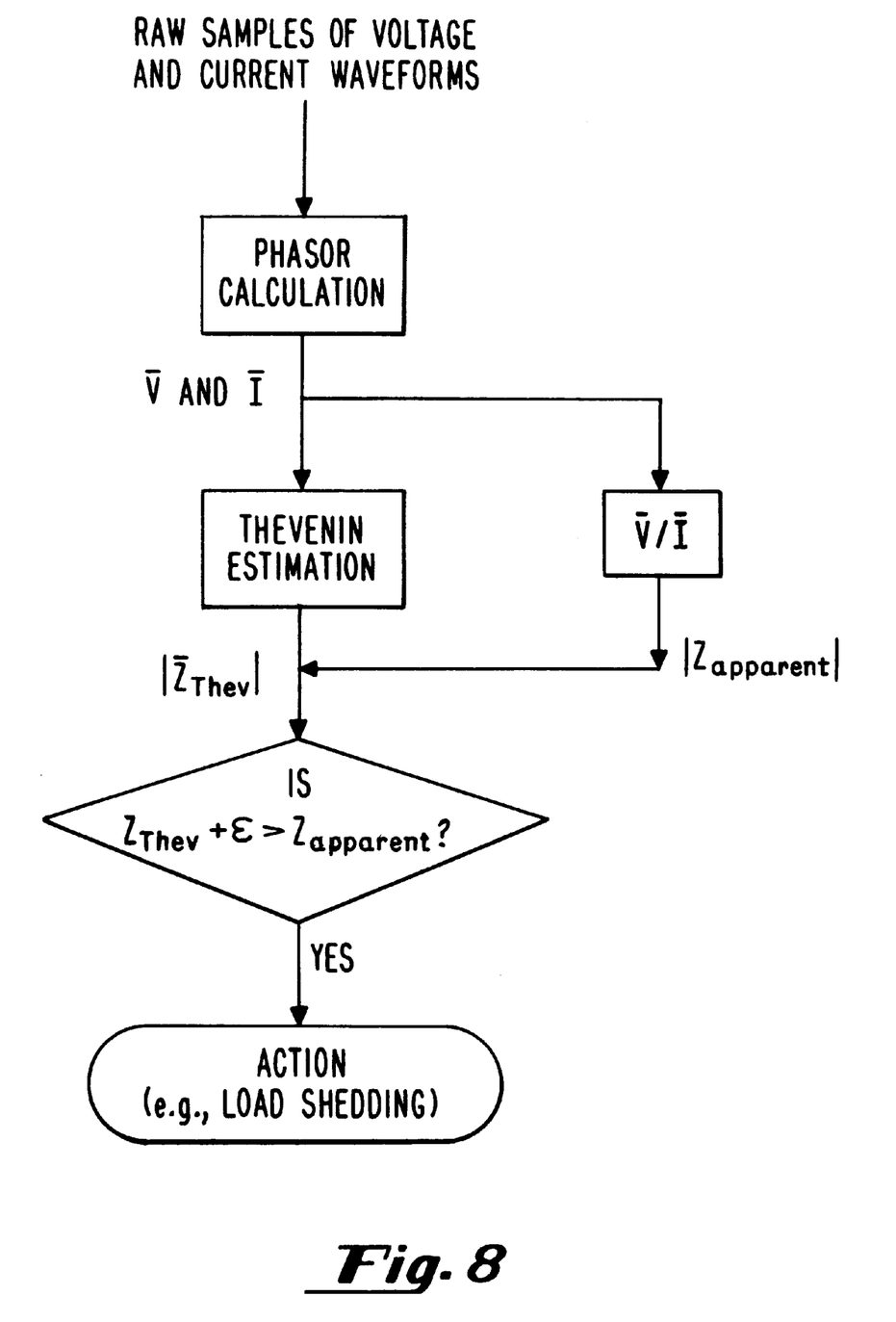
FIG. 8 is a flowchart of the operation of an adaptive relay in accordance with the present invention. The flowchart depicts how local voltage and current measurements are processed to detect proximity to voltage collapse. In the flowchart, $\epsilon > \geq 0$ represents a margin that is settable by the user.

The flowchart depicted in FIG. 8 provides a summary of the inventive process described herein. The steps involved include deriving voltage and current phasors ($\overline{V}, \overline{I}$) based on waveform measurements taken at the bus. Next, the magnitudes of the apparent impedance ($|\overline{Z}_{app}|$) and the Thevenin impedance ($|\overline{Z}_{Thev}|$) are determined. These values are then compared to determine whether the proximity of the apparent load impedance to the Thevenin impedance indicates that load shedding or other action should be taken.

Integration of Local Devices

Figure 9:
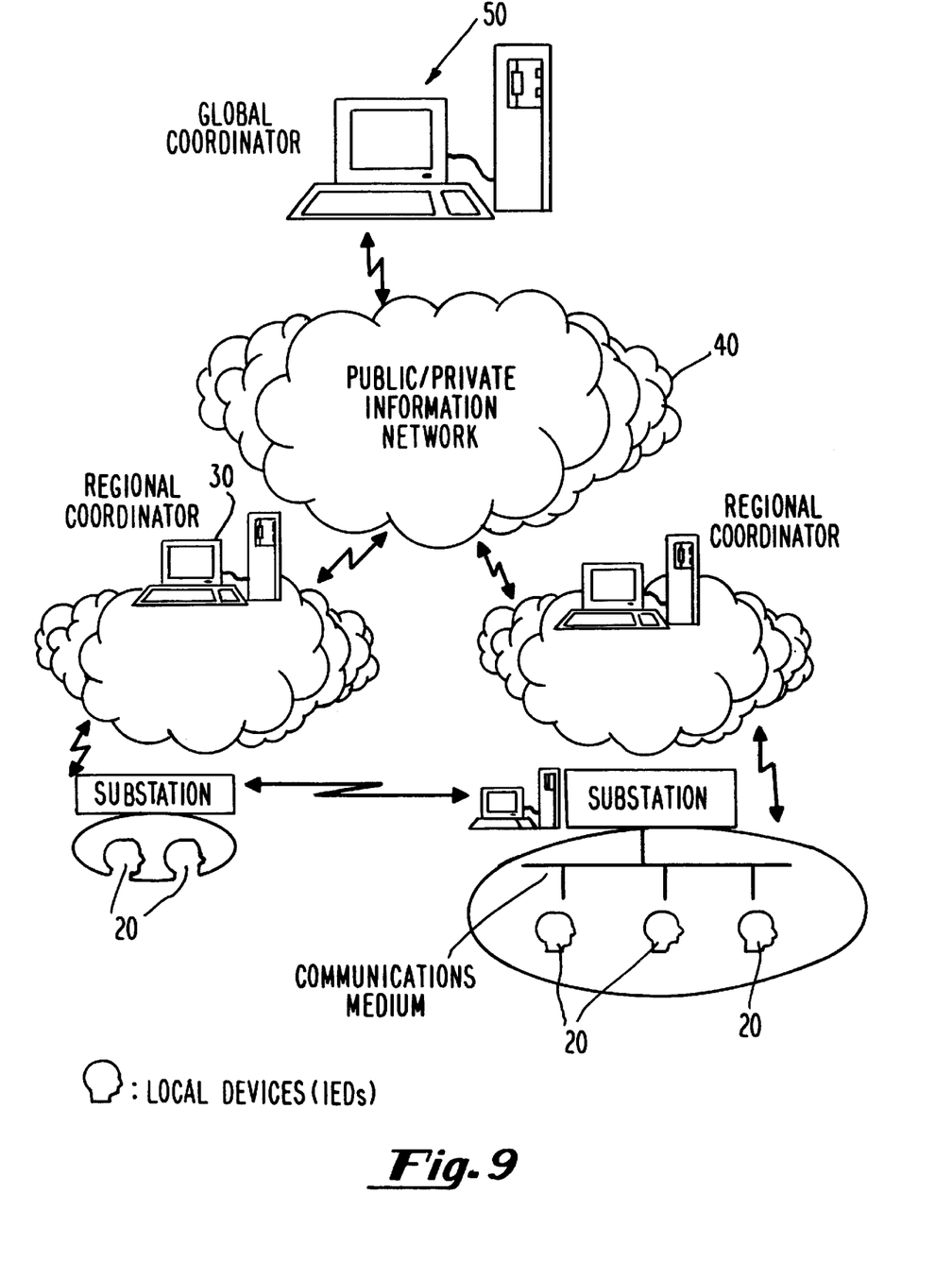
FIG. 9 schematically depicts an embodiment of the present invention in which VIP-based devices (or Intelligent Electronic Devices (IEDs)) are distributed in a wide area network.

Referring now to FIG. 9, which illustrates how a plurality of local VIP-based devices 20 (also called Intelligent Electronic Devices) may be connected through a wide area network comprising one or more regional control computer(s) 30 and a public or private information network 40 to a global controller/coordinator 50. Such VIP-based monitoring devices processing only local measurements are to be counted upon when other emergency controls fail to mitigate the aggravating situation. They also form the fall-back position for any global protection scheme when communications channels fail. The inventive monitoring device identifies the Thevenin equivalent of the network as seen from the local substation. This device can be used to assess the available power margins. The device may be developed so as to be only minimally sensitive to measurement errors. Though better than existing relays that try to achieve the same goal, it still represents an approximation of the network as seen from the local substation.

Should communications to the central computer be available, these monitoring devices can report their findings to the control center, as illustrated in FIG. 9. The central computer combines the reported proximities to collapse and issues coordinating actions. (In this case, the central computer can override the load-shedding decision of individual relays.) Implementing a wide-area protection and control system this way requires modest communications and ensures robustness against missing or wrong data. Even when communication links fail, the local relays can still operate, providing the fallback position.

Concluding Remarks

Tracking stability margins has always been a challenging problem because of nonlinearity. Toward practical applications, a key element that distinguishes one method from another relates to the information required. Most methods in existence today require that system-wide information be available. In contrast, the present invention needs only local information and is thus simpler to build. In addition, since the inventive monitoring device is allowed to control only the local bus, the inherent nonlinearity is of minor practical importance.

Proximity to a steady-state voltage instability can be tracked by estimating the Thevenin equivalent of the network as seen from the local substation. At the point of collapse, the Thevenin impedance is equal to the load's apparent impedance (in the absolute-value sense). This is an important aspect of the present invention. A relay employing the present invention functions like a voltage relay with an adaptive setting.

Potential uses of the present invention include (1) to impose a limit on the loading at each bus and to shed load when the limit is exceeded; and (2) to enhance existing voltage controllers such as static VAR compensators (SVCs). Coordinated control can be obtained if communication links are available; in which case, the output from each monitoring device can be sent to and combined at a central computer for a global decision. In such a multi-level hierarchy, the upper-level control normally takes precedence over local devices; however, in case of emergency, each monitoring device makes its own decision.

The above description of presently preferred embodiments of the invention is not intended to limit the scope of protection of the following claims. Thus, for example, except where they are expressly so limited, the following claims are not limited to applications involving three-phase power systems or power systems employing a 50 Hz or 60 Hz fundamental frequency. Moreover, the claims are not limited to relays associated with any particular part (i.e., transformer, feeder, high power transmission line, etc.) of a power system. In fact, the VIP can also be coded into many types of microprocessor-based controllers. One example is to control on-load tap-changing (OLTC) transformers. Such transformers tend to drain the reactive power from the system to support the voltage on the load side. If the VIP is placed on the supply side of the transformer, the VIP can detect when the drain becomes excessive, and thus the decision to block the OLTC can be carried out. Another exemplary use of the present invention is to enhance the performance of SVCs by adding voltage-collapse prediction. Traditionally, SVC behavior can mask an imminent collapse, leading to sudden and unexpected loss of power supply. The VIP can be used to ensure accurate collapse prediction, taking into account the SVC operation.

We claim:

1. A method for protecting an electrical energy transmission system including a source, a bus and a load, comprising the steps of:

(a) measuring current and voltage waveforms at the bus, and deriving current and voltage phasors therefrom;

(b) based on said current and voltage phasors, determining an apparent impedance ($\overline{Z}_{app}$) associated with the load and a Thevenin impedance ($\overline{Z}_{Thev}$) associated with the source, wherein said Thevenin impedance is tracked by a curve-fitting technique;

(c) comparing said Thevenin impedance and apparent impedances; and (d) deciding whether to initiate a prescribed action based on the relationship of the apparent impedance to the Thevenin impedance.

2. A method as recited in claim 1, wherein said prescribed action is load shedding.

3. A method as recited in claim 1, wherein said prescribed action is controlling on-load tap-changing (OLTC) transformers.

4. A method as recited in claim 1, wherein said prescribed action is initiated if a difference between the magnitudes of said Thevenin impedance and apparent impedance is less than a predetermined amount.

5. A method as recited in claim 4, wherein the difference between the magnitudes of said Thevenin impedance and apparent impedance is compared to multiple thresholds, and each threshold is linked to a separate block of a load to be shed if said difference falls below that threshold.

6. A method as recited in claim 1, wherein said apparent impedance represents a ratio between the voltage and current phasors.

7. A method as recited in claim 1, wherein said Thevenin impedance is estimated based on the following equation:

$$\overline{E} = \overline{V} + \overline{Z}_{Thev}\overline{I},$$

wherein $\overline{E} = E_r + jE_i$ is the Thevenin source voltage, $\overline{V} = u + jw$ is the measured voltage phasor at the bus, and $\overline{I} = g + jh$ is the measured current phasor at the bus; and wherein g, h, u and w are directly available from the measurements at the bus.

8. A method as recited in claim 7, wherein the following equation is employed to determine said Thevenin impedance:

$$\begin{bmatrix} 1 & 0 & -g & h \\ 0 & 1 & -h & -g \end{bmatrix} \times \begin{bmatrix} E_r \\ E_i \\ R_{Thev} \\ X_{Thev} \end{bmatrix} = \begin{bmatrix} u \\ w \end{bmatrix}$$

wherein $R_{Thev}$, $X_{Thev}$ and $E_r$ and $E_i$ are unknowns to be determined.

9. A method as recited in claim 8, wherein measurements taken at two or more different times are employed to solve for said unknowns $R_{Thev}$, $X_{Thev}$ and $E_r$ and $E_i$; and wherein an attempt is made to minimize any error in the values determined for said unknowns.

10. An impedance relay with a self-tuned setting, wherein the setpoint is based on a measured relationship between a load impedance and a Thevenin impedance, for use in protecting an electrical energy transmission system including a source, a bus and a load, comprising:

(a) means for deriving current and voltage phasors at the bus;

(b) means for determining the apparent impedance ($\overline{Z}_{app}$) associated with the load and the Thevenin impedance ($\overline{Z}_{Thev}$) associated with the source, the values of said impedances being determined on the basis of the current and voltage phasors, wherein the Thevenin impedance is tracked by a curve-fitting technique;

(c) means for comparing said Thevenin impedance and apparent impedances; and (d) means for deciding whether to initiate load shedding based on the relationship of the apparent impedance to the Thevenin impedance.

11. A voltage relay with an adaptive setpoint, wherein the setpoint is based on a measured relationship between a load impedance and a Thevenin impedance, for use in protecting an electrical energy transmission system including a source, a bus and a load, comprising:

(a) means for deriving current and voltage phasors at the bus;

(b) means for determining the apparent impedance ($\overline{Z}_{app}$) associated with the load and the Thevenin impedance ($\overline{Z}_{Thev}$) associated with the source, the values of said impedances being determined on the basis of the current and voltage phasors, wherein the Thevenin impedance is tracked by a curve-fitting technique;

(c) means for comparing said Thevenin impedance and apparent impedances; and (d) means for deciding whether to initiate load shedding based on the relationship of the apparent impedance to the Thevenin impedance.

* * * * *

UNITED STATES PATENT AND TRADEMARK OFFICE
CERTIFICATE OF CORRECTION

PATENT NO.  : 6,219,591 B1
DATED       : April 17, 2001
INVENTOR(S) : Khoi Tien Vu et al.

It is certified that error appears in the above-identified patent and that said Letters Patent is hereby corrected as shown below:

<u>Column 3,</u>
Line 47, delete "δhd Icould" and insert -- $\delta_1$ could --;
Line 61, delete "$|\overline{Z}_{Thev} + \overline{Z}_{app}| \times I = \overline{E}_{Thev}$" and insert -- $|\overline{Z}_{Thev} + \overline{Z}_{app}| \times I = \overline{E}_{Thev}$ --

Signed and Sealed this

Eighteenth Day of December, 2001

Attest:

Attesting Officer

JAMES E. ROGAN
*Director of the United States Patent and Trademark Office*